(12) United States Patent
Hoppe (10) Patent No.: US 7,453,259 B2
(45) Date of Patent: Nov. 18, 2008

(54) LOADING A SOCKET AND/OR ADAPTER DEVICE WITH A SEMICONDUCTOR COMPONENT

(75) Inventor: Holger Hoppe, Mering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/012,715

(22) Filed: Dec. 16, 2004

(65) Prior Publication Data

US 2005/0170689 A1    Aug. 4, 2005

(30) Foreign Application Priority Data

Dec. 18, 2003    (DE)    ................ 103 59 648

(51) Int. Cl.
*G01R 31/26*    (2006.01)
(52) U.S. Cl. .................. 324/158.1; 324/755; 324/758
(58) Field of Classification Search ......... 324/754–765; 439/259–270, 66–71
See application file for complete search history.

(56) References Cited

U.S. PATENT DOCUMENTS

| 4,733,462 | A |   | 3/1988 | Kawatani |
| 4,744,768 | A | * | 5/1988 | Rios ........................... 439/262 |
| 4,747,784 | A | * | 5/1988 | Cedrone ...................... 439/71 |
| RE33,466 | E |   | 12/1990 | Kato |
| 5,314,223 | A |   | 5/1994 | Harper, Jr. et al. |
| 6,279,225 | B1 | * | 8/2001 | Martin et al. ................. 29/740 |
| 6,402,528 | B2 | * | 6/2002 | Takahashi et al. ............ 439/70 |
| 6,462,534 | B2 |   | 10/2002 | Kang et al. |

FOREIGN PATENT DOCUMENTS

| DE | 36 20 944 A1 | 1/1988 |
| DE | 195 80 944 T1 | 1/1998 |
| DE | 19743211 C2 | 9/2002 |

* cited by examiner

*Primary Examiner*—Vinh P Nguyen
(74) *Attorney, Agent, or Firm*—Slater & Matsil, L.L.P.

(57) ABSTRACT

A process, device and apparatus for loading a socket and/or adapter device with a semi-conductor component, where the mechanism has a device, in particular a mechanical device, for instance and appropriate attachment for opening the socket and/or adapter device.

45 Claims, 4 Drawing Sheets

"closed"

"open"

LOADING A SOCKET AND/OR ADAPTER DEVICE WITH A SEMICONDUCTOR COMPONENT

CLAIM FOR PRIORITY

This application claims priority to Application No. 103 59 648.8, which was filed in the German language on Dec. 18, 2003.

TECHNICAL FIELD OF THE INVENTION

The invention relates to a socket and/or adapter device, in particular for testing a semi-conductor component, loaded into the socket and/or adapter device, and to an apparatus and a process for loading a socket and/or adapter device with a corresponding semi-conductor component, and to a precision alignment device to be used in a corresponding procedure.

BACKGROUND OF THE INVENTION

Semi-conductor components, for instance corresponding integrated (analog and/or digital) computer circuits, semi-conductor memory components, for instance functional memory components (PLAs, PALs, etc.) and table memory components (e.g. ROMs or RAMs, in particular SRAMs and DRAMs) are subjected to extensive testing during the manufacturing process.

For the simultaneous, combined manufacture of numerous (generally identical) semi-conductor components, a so-called wafer (i.e. a thin disk of monocrystalline silicon) is used.

The wafer is appropriately treated (for instance subjected in succession to numerous coating, exposure, etching, diffusion and implantation process steps, etc.), and then for instance sliced up (or scored and snapped off), so that the individual components become available.

After the wafer has been sliced up (and/or scored and snapped off) the—individually available components—are each individually loaded into special housings or packages (for instance, so-called TSOP or FBGA housings etc.) and then—by means of appropriate trays—transported to a corresponding further station, especially a test station (and/or in succession to several other test stations).

The above test station may for instance be a so-called "burn-in" testing station (at which, by creating extreme conditions (for instance increased temperatures) artificial aging of the components is caused) in particular a "burn-in" test station, at which the so-called burn-in test procedure is performed, i.e. a test done under extreme conditions (for instance increased temperature, for instance above 80° C. or 100° C., increased operational voltage, etc.).

At the (test) station each individual component—present in the above-mentioned housings—is loaded into a corresponding adapter and/or socket—connected to a corresponding test apparatus—and then the component in each housing is tested.

Loading the (burn-in) adapter and/or socket with a component to be tested can be done with the help of one or several appropriate loading apparatuses ("loaders").

For doing this, a grabber device, for instance a loader head, provided at an appropriate loading apparatus (loader), can be provided with a partial vacuum, with the help of which a component can be removed from a tray and then—by means of an appropriate (for instance a swiveling or shifting) motion of the grabber device and/or the "loader head"—positioned above a so-called precision alignment device.

Then the component positioned above the precision alignment device can be dropped by the loader of the grabber device—by reducing the vacuum—into one of the recesses provided with appropriate tapered guiding planes on the precision alignment device.

By means of the tapered guiding planes it can be achieved that the component and/or component housing is (pre- or coarsely) aligned by being dropped into the corresponding precision alignment recess.

Next the component can again be removed by the above loading apparatus (and/or by any additional loading apparatus) from the recess provided in the precision alignment device (for instance by creating a partial vacuum at the grabber device and/or the loader head provided at the above or at any additional loading apparatus).

Then the component can be positioned above a corresponding (burn-in) adapter and/or socket by means of an appropriate (for instance a swiveling or shifting) motion of the grabber device and/or the loader head.

Conventional (burn-in) adapters and/or sockets may for instance consist of a base element and a cover ("lid"), which is adjustable in a vertical direction in relation to the base element by means of corresponding spring sections attached to the base element.

By appropriate downward pressure on the adapter and/or socket cover, the adapter and/or socket can be "opened", whereafter the component suspended above the adapter and/or socket by the above loader the grabber device can be dropped into the adapter and/or socket by reducing the vacuum.

Appropriate tapered guiding planes can be provided inside the adapter and/or socket, for the purpose of—exactly—aligning the component and/or the component housing when it falls into the adapter.

When the adapter and/or the socket cover is then released again, it is forced upwards by the above-mentioned spring sections, whereby it is achieved that connections provided on the corresponding component (and/or component housing) make contact with connections provided on the corresponding adapter and/or socket, i.e. until the adapter and/or socket is "closed" so that the above test procedure can then be performed on the component.

In the manufacture/testing of semi-conductor components the above-mentioned (burn-in) adapters and/or sockets are usually required in relatively large numbers.

Conventional (burn-in) adapters and/or sockets are relatively expensive, due to the costly precision engineering of basic socket components and covers—which is needed to avoid faulty contacts between component (and/or component housings) and adapters and/or socket connections.

SUMMARY OF THE INVENTION

The invention discloses a socket and/or adapter device, in particular for semi-conductor components, as well as a novel apparatus and a novel process for loading a socket and/or adapter device with a corresponding semi-conductor component.

In one embodiment of the invention, an apparatus, especially a loader head, is provided for loading a socket and/or adapter device with a corresponding semi-conductor component, whereby the apparatus comprises a device, especially a mechanical device, for opening the socket and/or adapter device.

Particularly advantageously the device comprises one or more appropriate attachments, in particular one or more attachments provided with one or more corresponding tapered planes.

Advantageously the device is designed such that when the apparatus is moved towards the socket and/or adapter device, contacts and/or latches provided at the socket and/or adapter device are opened by the device, in particular the attachment/s.

Preferably the socket and/or adapter device will have no cover and/or lid.

Particularly advantageously the function assumed by a corresponding cover in conventional socket and/or adapter devices is taken over by the apparatus, in particular by the above-mentioned device.

In a particularly preferable embodiment of the invention, the socket and/or adapter device, in particular the socket contacts and/or latches, is/are directly opened by the device (without a socket and/or adapter cover being provided at all).

By dispensing with a socket and/or adapter cover the socket and/or adapter device can be produced considerably more simply and cheaply than conventional sockets and/or adapter devices.

In this way the—total—cost of manufacturing and/or testing of semi-conductor components can be reduced.

In addition, by dispensing with the socket and/or adapter cover the circulation of air in the "burn-in" station (which is adversely affected in conventional socket and/or adapter devices by the socket and/or adapter covers provided) can be improved.

In this way any unintended excessive heating of semi-conductor components loaded into the corresponding socket and/or adapter in the "burn in" station can be prevented, which—when conventional socket and/or adapter devices are used—can lead to damage to or destruction of the semi-conductor components.

BRIEF DESCRIPTION OF THE DRAWINGS

The invention is described in detail below with reference to exemplary embodiments and the attached drawings. In the drawings.

DETAILED DESCRIPTION OF THE INVENTION

Figure 1:
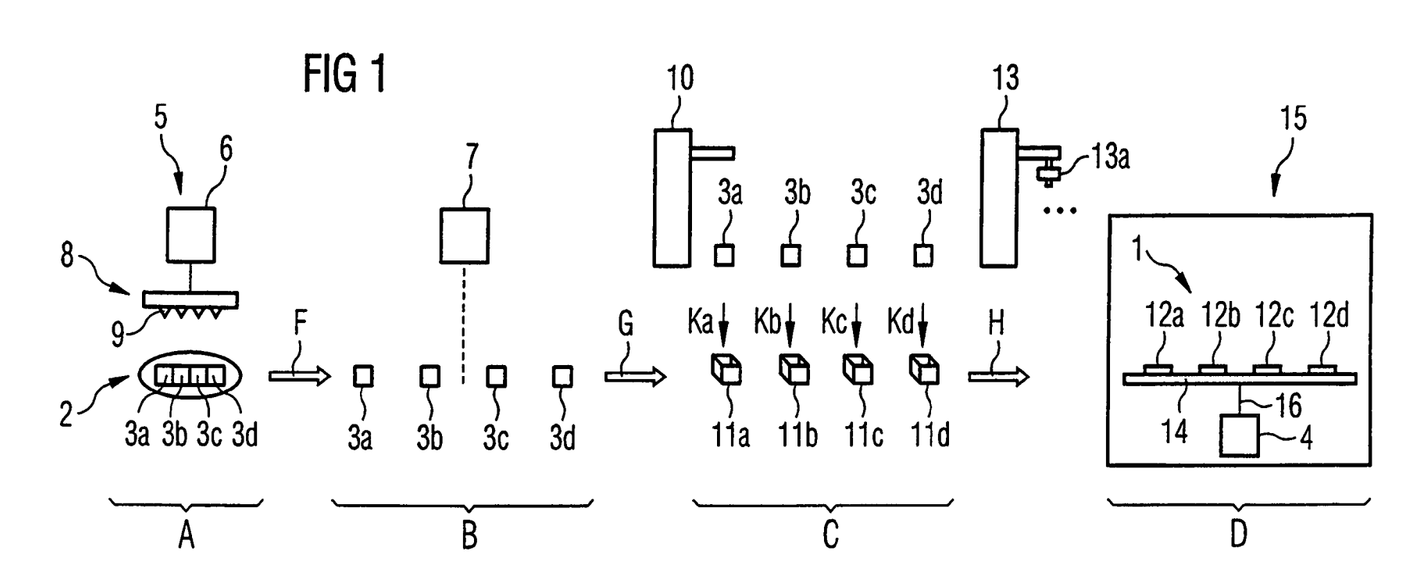
FIG. 1 shows various stations passed through during the manufacture of corresponding semi-conductor components.

In FIG. 1, some stations A, B, C, D (of several further stations not shown here) passed through by the corresponding semi-conductor components $3a$, $3b$, $3c$, $3d$ during the manufacture of the semi-conductor components $3a$, $3b$, $3c$, $3d$ are schematically—represented.

Station A serves to subject the semi-conductor components $3a$, $3b$, $3c$, $3d$—still present on a silicon disk or wafer 2 to one or more test procedures (for instance by means of an appropriate test system 5 such as of a test apparatus 6 and a semi-conductor component test card 8 and/or probe card 8 (which has been provided with contact pins 9 for contacting corresponding contacts on the semi-conductor components $3a$, $3b$, $3c$, $3d$)).

At stations not shown here and upstream from the stations A, B, C, D shown in FIG. 1, the wafer 2 has been subjected to conventional coating, exposure, etching, diffusion and implantation process steps etc.

The semi-conductor components $3a$, $3b$, $3c$, $3d$ may be integrated (analog and/or digital) computer circuits, or semi-conductor memory components, for instance functional memory components (i.e. PLAs, PALs, etc.), and table memory components, (for instance ROMs or RAMs), in particular SRAMs or DRAMs (here for instance DRAMs (Dynamic Random Access Memories and/or Dynamic Read-Write Memories) with double data rate (DDR DRAMs=Double Data Rate—DRAMs), preferably high-speed DDR DRAMs).

When the test procedure has been successfully completed at station A, wafer 2 is (fully automatically) transported to the next station B (see arrow F), where (after wafer 2 has had foil glued to it in a recognized fashion) it is sliced up by means of an appropriate machine 7 (or for instance scored and snapped off), so that the individual semi-conductor components $3a$, $3b$, $3c$, $3d$ become available.

After wafer 2 has been sliced up at station B, the components $3a$, $3b$, $3c$, $3d$ are then (again fully automatically—for instance by means of an appropriate conveyer machine—) transported to the next test station (here a loading station C)—for instance directly (and/or individually) or alternatively for instance by means of a tray) (see arrow G).

At the loading station C the components $3a$, $3b$, $3c$, $3d$ are each individually loaded in fully automatic fashion into corresponding housings $11a$, $11b$, $11c$, $11d$ and/or packages (see arrows $K_a$, $K_b$, $K_c$, $K_d$), with the help of machine 10 (loading machine) and the housings $11a$, $11b$, $11c$, $11d$ are then closed in recognized fashion so that the semi-conductor component contacts provided on the semi-conductor components $3a$, $3b$, $3c$, $3d$ make contact with corresponding housing contacts provided at each housing $11a$, $11b$, $11c$, $11d$.

Conventional TSOP housings or for instance conventional FBGA housings, etc. may be used for the housings $11a$, $11b$, $11c$, $11d$.

Next, the housings $11a$, $11b$, $11c$, $11d$—together with the semi-conductor components $3a$, $3b$, $3c$, $3d$ again fully automatically for instance by means of a corresponding conveyer, and where appropriate, by using a corresponding, tray 17 (for instance one shown in FIG. 2) are conveyed to a further station D, for instance a testing station (see arrow H), and/or in succession to several further stations, especially testing stations (not shown here).

Station D (or one or several of the above further stations, not shown here) may e a so-called "burn-in" station, especially a burn-in testing station.

At the burn-in station artificial aging of the components $3a$, $3b$, $3c$, $3d$ is caused by extreme conditions (for instance increased temperatures) being generated.

Additionally one or several burn-in test procedures can be performed at the burn-in station, i.e. tests done under extreme conditions (for instance increased temperatures, for instance above 80° C. or 100° C., and/or increased operating voltages, etc.)).

At station D the housings $11a$, $11b$, $11c$, $11d$—as is more closely described below—are loaded with the help of one or more appropriate machines (for instance a loading machine 13, "loader") (and where appropriate, a further, loading machine (a "loader", not shown here)) into specially designed "coverless" (burn-in) sockets and/or (burn-in) adapters 12a, 12b, 12c, 12d.

Figure 2:
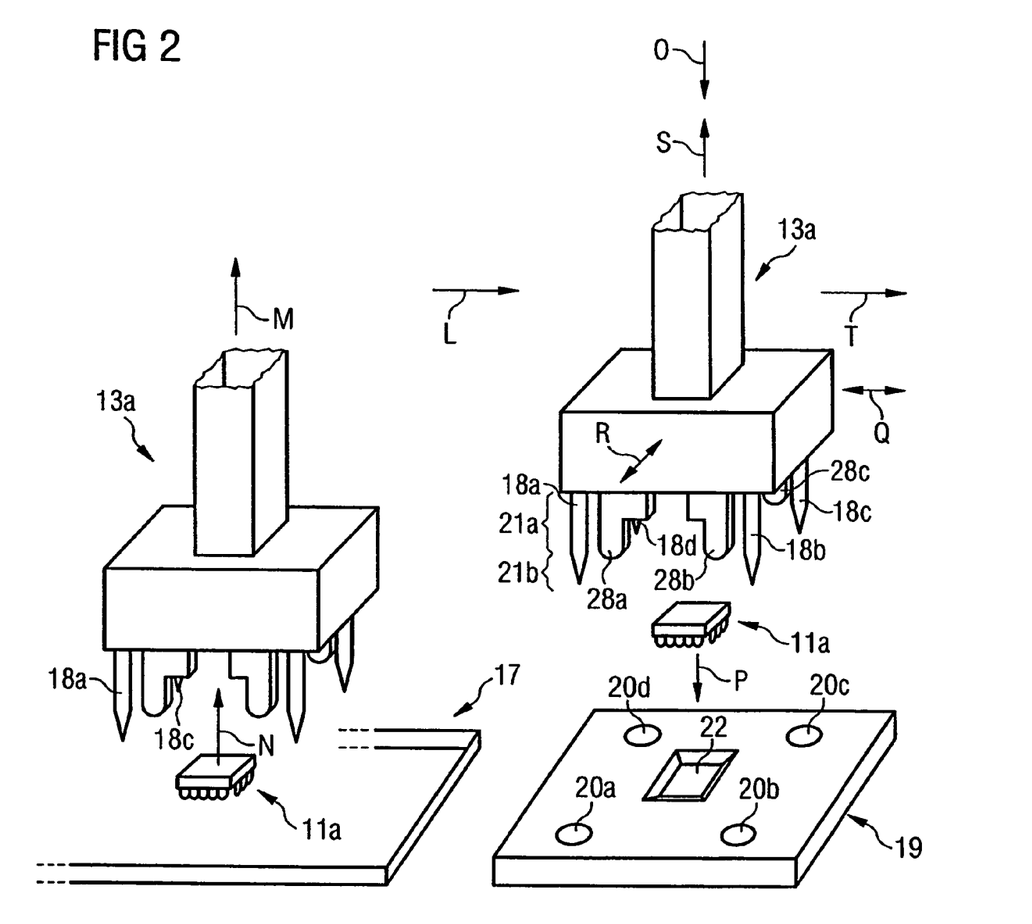
FIG. 2 shows a perspective representation of the grabber device of the loading machine used in the "burn-in" test system shown in FIG. 1, of a tray and a precision alignment device.

The loading machine 13 (and correspondingly also the further loading machine, where provided) has as shown in FIGS. 1 and 2 a grabber device and/or a loader head 13a.

To load a (burn-in) socket and/or (burn-in) adapter 12a with a corresponding component 3a and/or component-housing 11a, the grabber device 13a is first positioned as shown in FIG. 2 directly above the corresponding tray 17 (and/or more accurately: directly above the corresponding component 3a and/or component housing 11a) similar to conventional loading machines whereupon a suitable vacuum is created at the grabber device and/or the loader head 13a (and/or more accurately: below the grabber device and/or the loader head 13a).

In this way the component 3a arranged in a corresponding housing 11a and lying on tray 17 (similarly constructed to conventional trays) is moved upwards in the direction of arrow N as shown in FIG. 2 and firmly held by the underside 13b of the grabber device 13a (essentially in the middle of several centering devices 18a, 18b, 18c, 18d, more accurately described below) i.e. the component 3a is removed from tray 17.

Next, by means of an appropriate movement (for instance swiveling or shifting) of the grabber device 13a and/or the loader head 13a (for instance first upwards in the direction of the arrow M shown in FIG. 2, and then laterally in the direction of the arrow L shown in FIG. 2, etc.), the grabber device 13a, together with the component 3a and/or component housing 11a held at the underside 13b of the grabber device 13a by the vacuum being maintained is positioned above the precision alignment device 19 shown to the right in FIG. 2 (more accurately: above a centering recess 22 of the precision alignment device 19).

Figure 4:
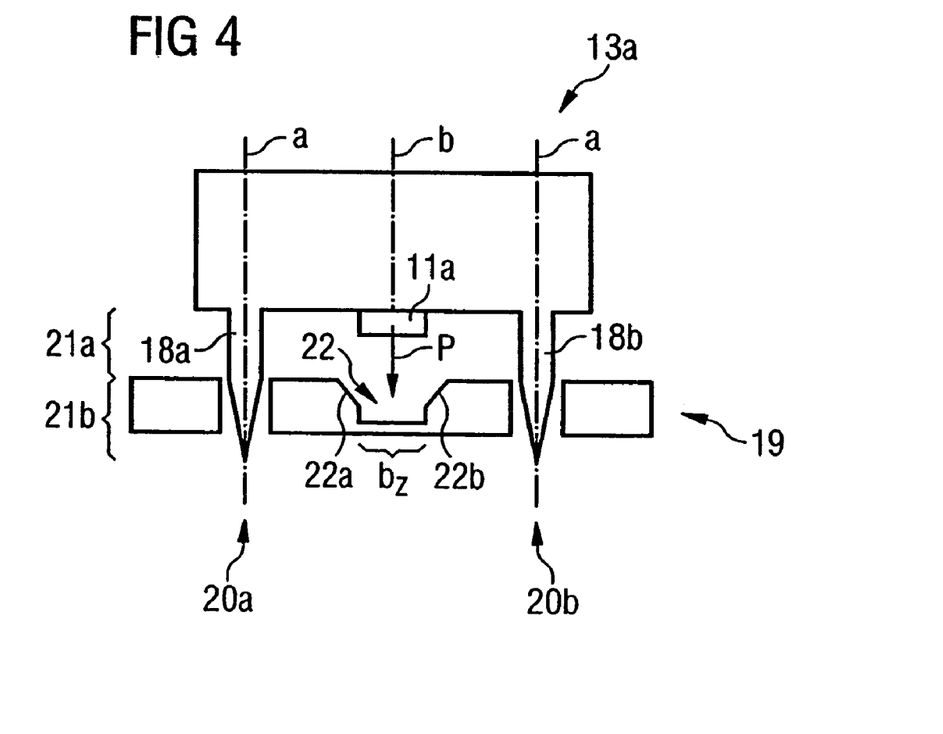
FIG. 4 shows a sectional view of the grabber device shown in FIGS. 2 and 3, and the precision alignment device alignment shown in FIG. 2.

The precision alignment device 19 is similarly constructed to conventional precision alignment devices, yet has been provided—as shown in FIG. 2 and FIG. 4—with several centering holes 20a, 20b, 20c, 20d on the underside 13b of the grabber device 13a for receiving the above centering devices 18a, 18b, 18c, 18d.

The centering holes 20a, 20b, 20c, 20d are essentially circular in section and reach—with an essentially constant inside diameter—partially or completely downwards through the whole precision alignment device 19 in a vertical direction from the upper side of the precision alignment device 19.

As shown in FIGS. 2 and 4, the centering devices 18a, 18b, 18c, 18d provided on the grabber device 13a reach vertically downwards from the underside of the grabber device. Each of the centering devices 18a, 18b, 18c, 18d (here: four, alternatively for instance two or three, etc.) has—as is for instance apparent from FIG. 3 when seen from below—an essentially circular cross section.

As shown in FIG. 4, the vertical axes of the centering devices 18a, 18b, 18c, 18d, running centrally through the conical sections of the centering devices 18a, 18b, 18c, 18d, are—when the grabber device 13a has been correspondingly aligned in alignment with the central vertical axes of the corresponding centering openings 20a, 20b, 20c, 20d of the precision alignment device 19.

The inside diameter of each centering opening 20a, 20b, 20c, 20d is essentially identical to the maximum outside diameter of the corresponding conical sections 21b of each centering device 18a, 18b, 18c, 18d (at the top end of the corresponding conical sections 21b), i.e. the outside diameter of the corresponding cylindrical sections 21a of each of the centering devices 18a, 18b, 18c, and/or 18d is somewhat smaller.

The grabber device 13a and/or the loader head 13a is supported on a "floating" bearing in relation to the other parts of the loading machine 13.

When the grabber device 13a is moved from the position shown at the top right-hand side in FIG. 2a, i.e. from above the precision alignment device 19 (and/or above the centering recess 22 of the precision alignment device 19) in the direction of the arrow O—vertically downwards to for instance the position shown in FIG. 4 (or even further downwards), the centering devices 18a, 18b, 18b, 18c (and/or their conical sections 21b) provided on the underside of the grabber device 13a, are inserted into each corresponding centering opening 20a, 20b, 20c, 20d of the precision alignment device 19.

Due to the above-mentioned "floating" bearing of the grabber device 13a (i.e. due to its lateral flexibility) the grabber device 13a—not yet accurately centered and/or aligned in relation to the precision alignment device 19 and/or its centering-recess 22—is centered and/or aligned (i.e. moved slightly laterally as—shown by the arrows Q and R in FIG. 2—so that once the centering devices 18a, 18b, 18b, 18c have been inserted into each of the corresponding centering openings 20a, 20b, 20c, 20d, the central axes a of the centering devices 18a, 18b, 18b, 18c coincide with the corresponding central axes a of the centering openings 20a, 20b, 20c, 20d of the precision alignment device 19.)

The component 3a and/or component-housing 11a—suspended above the precision alignment device 19 and/or its centering recess 22 is then dropped into the centering recess 22 by the grabber device 13a (for instance arrow P in FIGS. 2 and 4) by releasing the vacuum.

The centering recess has as is for instance shown in FIG. 4 tapered sides 22a, 22b.

The tapered sides 22a, 22b run at an angle downwards and inwards from the inside edges of the centering recess 22 on the upper side of the precision alignment device 19.

At a lower point inside the centering recess 22 the dimensions of the centering-recess 22 essentially correspond with the dimensions of component 3a and/or component housings 11a (for instance the width—as shown in FIG. 4—of the centering recess 22 in the above-mentioned lower point essentially corresponds with the width of component 3a and/or the component-housing 11a, and the length of the centering recess 22 essentially corresponds with the length of the component 3a and/or component housing 11a).

By means of the guiding tapers 22a, 22b it can be achieved that component 3a and/or the component housing 11a—and thereby also the grabber device 13a—is appropriately aligned and/or centered in relation to the precision alignment device 19 (i.e. moved slightly in a lateral direction when falling into the centering recess 22, so that when, after falling into the centering recess 22, the central axis a of the component 3a and/or component housing 11a coincides exactly with the corresponding central axis b of the centering recess 22).

Next the grabber device 13a of the above loading machine 13 (or a grabber device of an additional loading machine) for instance at the setting of the grabber device 13a shown in FIG. 4, or at a setting in which the grabber device 13a has been moved even further downwards until the underside 13b of the grabber device 13a touches the component 3a and/or component housing 11a—can again remove the component 3a and/or component-housing 11a from the centering recess 22 provided in the precision alignment device 19 (for instance by (again) creating a vacuum at the grabber device 13a and/or the loader head 13a (and/or more accurately: underneath the grabber device 13a and/or the loader head 13a).

Hereby the component 3a and/or component-housing 11a, inserted in the centering recess 22, is pulled upwards against the direction of the arrow P shown in FIGS. 2 and 4, and as shown in FIG. 3 again held at the underside 13b of the grabber device 13a (by now due to the centering of the component 3a in relation to the precision alignment device 19, and the centering of the grabber device 13a in relation to the precision alignment device 19 for instance in the middle between the above-mentioned centering devices 18a, 18b, 18c, 18d, i.e. in a way that aligns it, in particular, centers it in relation to the grabber device 13a).

Figure 5:
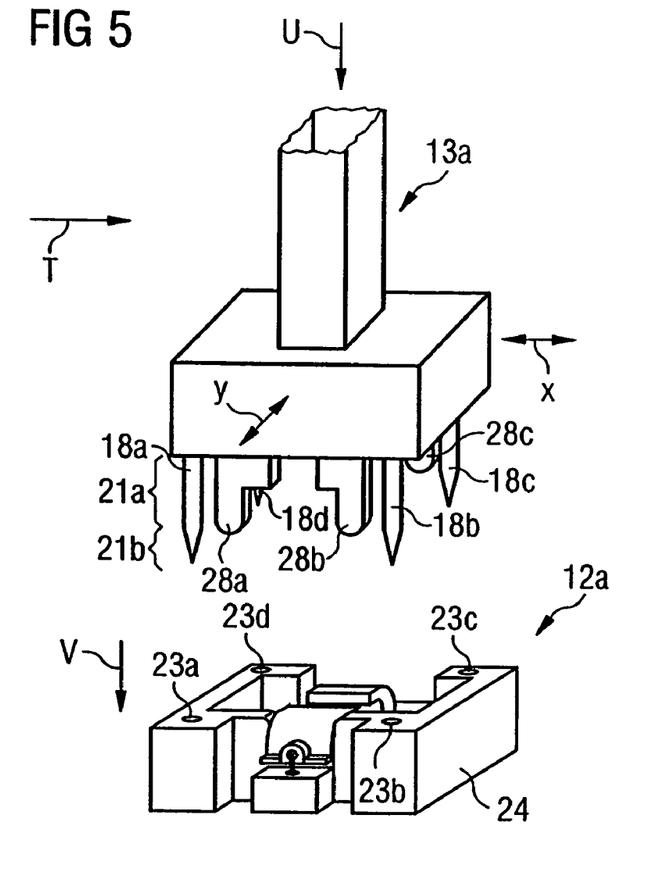
FIG. 5 shows a perspective representation of the grabber device, and of an adapter and/or socket.

Next by appropriately moving (for instance by swiveling and/or shifting) the grabber device 13a and/or the loader head 13a (for instance initially upwards in the direction of the arrow S shown in FIG. 2, and then laterally in the direction of the arrow T shown in FIG. 2 and FIG. 5, etc.) the grabber device 13a is held while the vacuum is maintained for instance together with the centered and/or aligned component 3a and/or component-housing 11a at the underside 13b of the grabber device 13a—in position above a corresponding (burn-in) socket and/or (burn-in) adapter 12a, 12b, 12c, 12d (cf. FIG. 5).

As is clear from FIG. 5, the (burn-in) adapters and/or sockets 12a, 12b, 12c, 12d each has—in contrast to conventional (burn-in) sockets and/or adapters—a base element 24 but no cover (which in conventional (burn-in) sockets and/or adapters has been fitted above a corresponding base element, and is vertically moveable in relation to the base element 24, for instance in a vertical direction, due to spring elements fitted in between).

Furthermore the (burn-in) adapters and/or sockets 12a, 12b, 12c, 12d—in contrast to conventional sockets and/or adapters—have no tapered component guiding planes and/or "guide" devices.

The sockets and/or adapters 12a, 12b, 12c, 12d—and/or more accurately: the sockets and/or adapter base elements 24 (used here without covers)—can otherwise be constructed essentially similar or identical to conventional "burn in" sockets and/or "burn in" adapters (and/or more accurately: to corresponding sockets and/or adapter base elements), for instance correspondingly similar or identical to the base elements of conventional "open top" sockets, in particular TSOP sockets (or for instance correspondingly similar or identical to the base elements of FBGA "burn in" sockets, etc.), for instance correspondingly similar or identical to the burn in sockets base elements in the model range NP367 of the Yamaichi company (here for instance schematically represented) etc.

As is apparent from FIG. 5 and is more closely described below, the openings provided in the base element 24 (and used in conventional socket base elements for attaching springs) can in the present embodiment be used as centering holes 23a, 23b, 23c, 23d (instead of as attachment points for springs). Naturally, separate centering openings may also be provided in the base element 24 as an alternative.

The centering openings 23a, 23b, 23c, 23d have similar to the centering openings 20a, 20b, 20c, 20d provided at the precision alignment device 19 a circular cross-section, and run vertically downwards with an essentially constant inside diameter in each case from corresponding corner areas on the upper side of the base element 24 of the socket and/or adapter passing partially or wholly through the entire base element 24.

As is clear from FIG. 5, the central vertical axes a of the centering devices 18a, each passing through the middle of the conical sections 21a of the centering devices 18a, 18b, 18c, 18d, 18b, 18c, 18d coincide when the grabber device 13a is appropriately aligned with the corresponding centering openings 23a, 23b, 23c, 23d of the adapter and/or socket 12a.

The inside diameter of each centering opening 23a, 23b, 23c, 23d essentially coincides just as is the case with the corresponding centering openings 20a, 20b, 20c, 20d of the precision alignment device 19 with the maximum dimension of the outside diameter of the conical sections 21b provided on each centering device 18a, 18b, 18c, 18d (at the top end of the corresponding conical sections 21b), i.e. with the outside diameter of the corresponding cylindrical sections 21a of each centering device 18a, 18b, 18c, 18d.

As already described above, the grabber device 13a and/or the loader head 13a are attached by means of a "floating" bearing in relation to the other parts of the machine 13.

When the grabber device 13a is moved vertically downwards from the setting shown in FIG. 5 above the adapter and/or socket 12a in the direction of the arrow U the centering devices 18a, 18b, 18b, 18c, provided at the bottom of the grabber device 13a, are inserted into each centering opening 23a, 23b, 23c, 23d of the socket and/or adapter 12a.

As a result of the above-mentioned "floating" attachment of the grabber device 13a (i.e. its ability to move laterally) the grabber device 13a—not yet exactly centered and/or aligned—is centered and/or aligned in relation to the adapter and/or socket 12a as shown in FIG. 5 by the arrows X and Y—e.g. moved laterally to a certain extent, so that once the centering devices 18a, 18b, 18b, 18c have been inserted into the centering openings 23a, 23b, 23c, 23d provided in each case, the central axes a of the centering devices 18a, 18b, 18b, 18c coincide with the corresponding central axes of the centering openings 23a, 23b, 23c, 23d of the socket and/or adapter 12a.

Conventional sockets and/or adapters (in particular the contacts and latches provided there) can be "opened" by means of appropriately depressing the adapter and/or socket covers (in the direction of arrow V shown in FIG. 5) and after the adapter and/or socket covers have been released, can again be "closed".

This function of the cover (in particular opening and closing the above-mentioned socket contacts and latches) is taken over—in the case of the present "coverless" socket and/or adapter 12a—by the grabber device 13a, in particular by the special attachments (shown schematically here) 28a, 28b, 28c (and/or pins 28a, 28b, 28c or studs 28a, 28b, 28c) which have been provided on the grabber device 13a in addition to the above-mentioned centering devices 18a, 18b, 18c, 18d.

Figure 3:
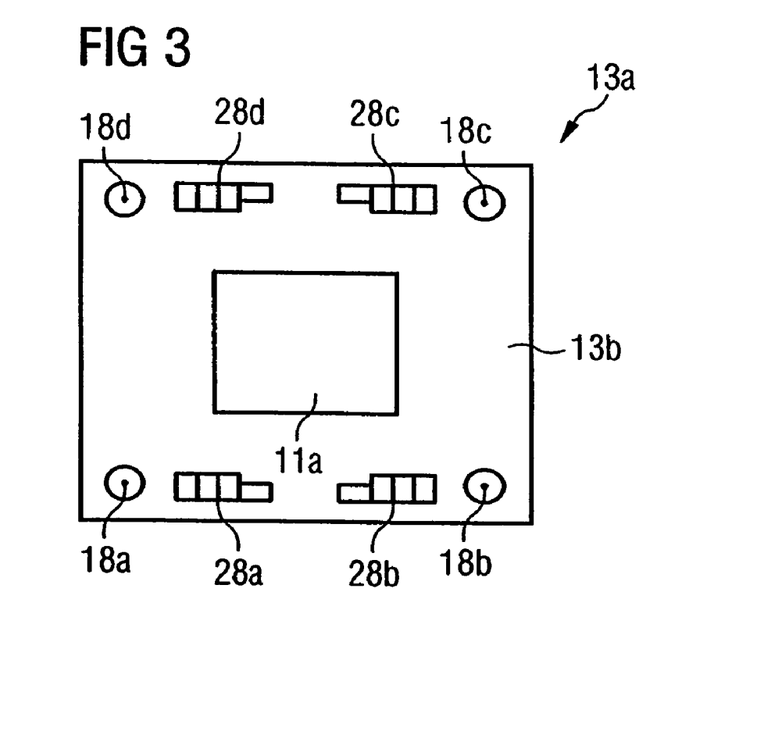
FIG. 3 shows a view from below of the grabber device shown in FIG. 2.

These reach down vertically—as is apparent from FIGS. 2, 3 and 5—downward from the underside 13b of the grabber device 13a.

The attachments 28a, 28b, 28c (and/or pins 28a, 28b, 28c or studs 28a, 28b, 28c) may be constructed correspondingly similar or identical to attachments and/or pins provided on the underside of conventional socket and/or adapter covers, for instance similar or identical to attachments and/or pins provided on conventional "open top" socket covers, in particular "burn-in" socket covers, for instance TSOP socket covers (or for instance FBGA socket covers, etc.), or for instance correspondingly similar or identical to the attachments and/or pins provided on the burn-in socket covers of sockets in the NP367 model range of the Yamaichi company (here for example—schematically—represented), etc. (in particular corresponding to the respective design of the socket base elements 24).

For example, corresponding tapered planes 29, can be provided at the attachments 28a, 28b, 28c and/or pins 28a, 28b, 28c similar or identical to attachments and/or pins provided at the underside of conventional socket and/or adapter covers with which in order to open and close the above-mentioned socket contacts and latches (mechanical) devices at the socket base element 24 can be operated.

In the present embodiment the grabber device 13*a* is moved vertically downwards from the setting shown in FIG. 3 above the adapter and/or socket 12*a* in the direction of the arrow U that the attachments 28*a*, 28*b*, 28*c* and/or pins 28*a*, 28*b*, 28*c* provided at the bottom of the cover (correspondingly similarly to the attachments and/or pins provided on conventional sockets and/or adapters) "open" the sockets and/or adapters 12*a* provided there.

Thereby for instance correspondingly similar to conventional sockets and/or adapters the vertical movement of the attachments 28*a*, 28*b*, 28*c* and/or pins 28*a*, 28*b*, 28*c* (for instance arrow U, shown in FIGS. 5 and 6) can be Converted into an appropriate horizontal movement, corresponding to that of an operating mechanism (arrow Z, FIG. 6) by means of a corresponding mechanical device 30 provided at or attached to the socket and/or adapter 12*a* (for instance a device also containing the corresponding tapered planes 31).

Figure 6:
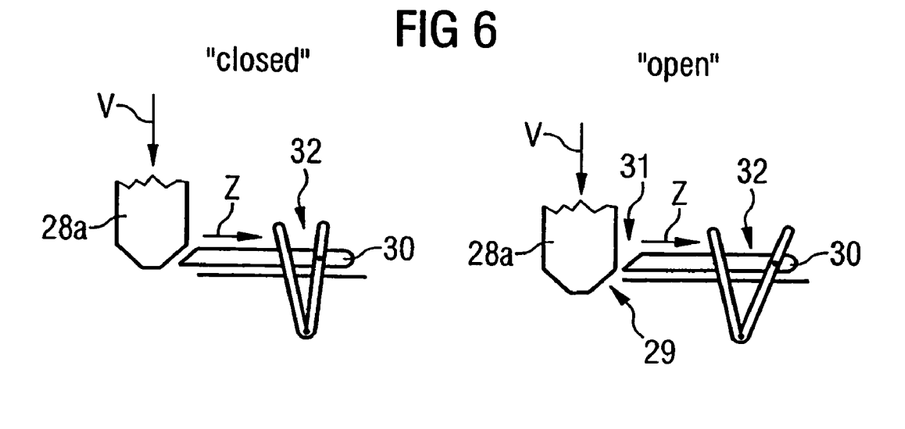
FIG. 6 shows a highly simplified representation of a grabber device attachment shown in FIGS. 2, 3 and 5, a contact operating device, and a V-shaped socket contact, at closed and open settings of the socket contact.

With the help of the mechanical device 30 and/or a corresponding operating mechanism (and/or its movement in a horizontal direction) the shanks of a V-shaped contact terminal 32 of the socket and/or adapter 12*a*, (initially slightly) open towards the top end and pre-tensioned towards a "closed" setting by means of corresponding spring devices connected to operating mechanism(s), can be moved apart (on a horizontal plane) thereby being prepared to receive a component and/or component housing connection (shown in FIG. 6 schematically as an example and represented in highly simplified form).

Advantageously the grabber device 13*a* is forced downwards in the direction of arrow U, until the component 3*a* and/or component-housing 11*a*, still held by the vacuum being maintained at the underside 13*b* of the grabber device 13*a* touches the top of the base element 24 in the inner part of the socket 12*a*, and the connections of the component 3*a* and/or component housing 11*a* are inserted into the corresponding (wide open) contact terminals 32 of the socket and/or adapter 12*a*. Then the vacuum is released and the component 3*a* and/or component-housing 11*a* released.

In other words, the component 3*a* and/or component-housing 11*a* is gently placed into the adapter and/or socket 12*a*, and not as with conventional grabber devices aligned with the help of tapered guide planes provided at the sockets and/or adapter by being dropped into the adapter and/or socket.

This gentle placing action is possible because the component 3*a* and/or the component-housing 11*a* has already been relatively accurately aligned in relation to the grabber device 13*a* by means of the process described above (i.e. at the precision alignment device 19), and by inserting the centering devices 18*a*, 18*b*, 18*c*, 18*d* of the grabber device 13*a* into the centering openings 23*a*, 23*b*, 23*c*, 23*d* provided at the socket and/or adapter 12*a* the grabber device 13*a* is additionally aligned with relatively high accuracy in relation to the socket and/or adapter 12*a*.

After the component 3*a* and/or component housings 11*a* have been placed into sockets 12*a*, the grabber device 13*a*, with attachments and/or pins 28*a*, 28*b*, 28*c* (and the centering devices 18*a*, 18*b*, 18*c*, 18*d*) is retracted vertically upwards, whereby (in corresponding fashion, as if the cover of a conventional adapter and/or socket 12*a* had been released, i.e. moved upwards again) the adapter and/or socket 12 and/or the contacts and latches provided there is "locked" again.

In this way secure electrical contact is made between the terminals provided on each component 3*a* (and/or component housing 11*a*) and the terminals provided at the adapter and/or socket 12*a* (for instance by the shank of the above-mentioned V-shaped contact terminal 32 again released by attachments and/or pins 28*a*, 28*b*, 28*c* being forced, by means of spring pressure provided by the above-mentioned spring devices against a component and/or component housing contact, which had been inserted into contact terminal 32).

In similar fashion to that described above, the grabber device 13*a* (or it being the case the above further grabber device) can load a multitude of further adapters and/or sockets 12*b*, 12*c*, 12*d*, and/or the component-housings 11*b*, 11*c*, 11*d* etc. similarly constructed to the socket and/or adapter 12*a* shown in FIG. 5 with components 3*b*, 3*c*, 3*d*, etc. (for instance at a rate of more than 100 or 1,000 adapters and/or sockets per hour).

In each case, several of these sockets and/or adapters 12*a*, 12*b*, 12*c*, 12*d* (for instance more than 50, 100 or 200 sockets and/or adapters 12*a*, 12*b*, 12*c*, 12*d*) have been connected as can be seen in FIG. 1 to one and the same card 14 and/or board 14 at testing station D (and/or to one and the same test card and/or test board 14) (for instance more than 50, 100 or 200 sockets and/or adapters 12*a*, 12*b*, 12*c*, 12*d*).

The test-board 14 (and thereby also the semi-conductor components 3*a*, 3*b*, 3*c*, 3*d* and/or housing 11*a*, 11*b*, 11*c*, 11*d* loaded into the sockets and/or adapters 12*a*, 12*b*, 12*c*, 12*d*) are loaded as shown in FIG. 1 with the help of an appropriate machine into an "oven" 15 that can be shut (and/or into an apparatus 15, with which extreme conditions can be created for the above semi-conductor components 3*a*, 3*b*, 3*c*, 3*d* (for instance increased temperatures, for instance above 70° C., 100° C., or 150° C., and/or increased component operating voltages, etc.)).

The test-card 14 and/or the test board 14 is in each case in the conventional manner, connected to a test apparatus 4, for instance by means of corresponding lines 16.

This causes the test signals being generated by the test apparatus 4 to be relayed, for instance by means of the above lines 16, to the test card 14, and from there to the sockets 12*a*, 12*b*, 12*c*, 12*d*, and their socket contact pins (not shown here) by means of the card contacts.

From the sockets 12*a*, 12*b*, 12*c*, 12*d* the test signals are then relayed via the above socket connections and the housing connections making contact with them to the housings 11*a*, 11*b*, 11*c*, 11*d*, and from there via the above housing contacts and the semi-conductor component contacts making contact with them, to the semi-conductor components 3*a*, 3*b*, 3*c*, 3*d* to be tested.

The signals emitted in reaction to the test signals applied to corresponding semi-conductor component contacts are then scanned by housing contacts (in contact with them) and led via the sockets 12*a*, 12*b*, 12*c*, 12*d*, the card 14 and lines 16 to the test apparatus 4, where the signals can then be evaluated.

Thereby the test system 1 which includes inter alia the test apparatus 4, the card 14 and the sockets 12*a*, 12*b*, 12*c*, 12*d* can perform a conventional test procedure for instance a conventional "burn-in" test (or several similar tests in succession), in which and/or in the course of which for instance the functionality of the semi-conductor components 3*a*, 3*b*, 3*c*, 3*d* can be evaluated (for instance while or after the semi-conductor components are being or have been subjected to the above-mentioned extreme conditions in the above "oven" 15 or the apparatus 15 for a relatively long period of time (for instance for more than 30 minutes, and/or more than one hour)).

What is claimed is:

1. An apparatus for loading a socket with a semiconductor component, the apparatus comprising:
   a grabber device for grabbing the semiconductor component, the grabber device comprising a device for opening the socket when the grabber device with the semiconductor component is moved toward the socket; and a centering device that aligns the grabber device in relation to the socket and in relation to an alignment device that aligns the semiconductor component to a correct position with respect to the grabber device when the grabber device is coupled with the alignment device, wherein the alignment device and the socket are physically separate units.

2. The apparatus according to claim 1, wherein contacts provided at the socket are opened by the device for opening the socket.

3. The apparatus according to claim 1, wherein the device for opening the socket is an attachment to the apparatus which is provided with a corresponding tapered plane.

4. The apparatus according to claim 1, wherein the grabber device is designed such that when the apparatus is moved toward the socket, contacts provided at the socket are opened by the grabber device.

5. The apparatus according to claim 1, wherein the centering device has a tapered plane.

6. The apparatus according to claim 5, wherein the centering device has a conical section.

7. The apparatus according to claim 1, wherein the centering device comprises a plurality of pins that align with corresponding centering openings disposed on the alignment device.

8. The apparatus according to claim 1, wherein the centering device comprises a plurality of pins that align with the corresponding centering openings disposed on the socket.

9. The apparatus according to claim 1, wherein the alignment device comprises a centering recess, the centering recess having an outer dimension substantially similar to an outer dimension of the semiconductor component, wherein the centering recess is positioned so that the semiconductor component becomes positioned on the grabber device to correct position with respect to the socket.

10. The apparatus according to claim 9, wherein the centering recess comprises tapered sides, wherein the tapered sides guide the semiconductor component into the centering recess when the grabber device is coupled with the alignment device.

11. The apparatus according to claim 1, wherein the apparatus comprises:
a base element and contacts to be opened by the grabber device, wherein the centering device comprises a first shape which fits into a corresponding second shape in the alignment device and into a corresponding third shape in the socket, wherein the alignment device comprises a recess for centering the semiconductor component in a correct position for placement in the socket, and wherein the alignment device, the grabber device, and the socket are all physically separate units.

12. The apparatus according to claim 11, wherein the grabber device further comprises an attachment, wherein the attachment pushes a mechanical device within the socket as the grabber device is moved toward the socket, and the mechanical device opens the socket as a tapered plane on the attachment pushes the mechanical device.

13. The apparatus according to claim 11, wherein the first shape comprises a centering pin and the second and third shapes each comprises a centering hole, wherein the centering pin fits within the centering holes.

14. The apparatus according to claim 1, wherein the centering devices centers the grabber device in relation to the socket and in relation to the alignment device.

15. A process for loading a socket with a semiconductor component, the process comprising:

aligning a semiconductor component in relation to a first socket loading apparatus, assistance of a centering device provided at the first socket loading apparatus and an alignment device, wherein the alignment device is not disposed within the socket;

after aligning the semiconductor component, removing the first socket loading apparatus from the alignment device;

grabbing the semiconductor component using a second socket loading apparatus after removing the first socket loading apparatus;

aligning the second socket loading apparatus in relation to the socket, with assistance of a centering device provided at the second socket loading apparatus; and opening contacts in the socket with the second socket loading apparatus, wherein the opening comprises activating a mechanical device disposed within the socket by physically coupling a pin on the second socket loading apparatus to the mechanical device, wherein the mechanical device causes the contacts to open.

16. The process according to claim 15, wherein the alignment device comprises a recess dimensioned to receive the semiconductor component, wherein the alignment device mechanically shifts the semiconductor component into an aligned position while the first socket loading apparatus and the alignment device are coupled, wherein the aligned position of the semiconductor component on the first socket loading apparatus corresponds with the aligned position with respect to the socket.

17. The process according to claim 15, wherein the opening contacts in the socket further comprises moving the second socket loading apparatus toward the socket.

18. The process according to claim 15, wherein the centering device provided at the first socket loading apparatus is an attachment and comprises a tapered plane.

19. The process according to claim 15, wherein the second socket loading apparatus and the socket each comprise complementary shapes which allow motion in a vertical direction but limit motion in a horizontal direction.

20. The process according to claim 19, further comprising:
moving the second socket loading apparatus toward the socket in the vertical direction; and
inserting an attachment provided at the second socket loading apparatus into a recess provided at the socket.

21. The process according to claim 15, wherein the first socket loading apparatus and the second socket loading apparatus are the same socket loading apparatus.

22. The process according to claim 15, wherein aligning the semiconductor component in relation to the first socket loading apparatus comprises centering the first socket loading apparatus in relation to the alignment device, and wherein aligning the second socket loading apparatus in relation to the socket comprises centering the second socket loading apparatus in relation to the socket.

23. The process according to claim 15, wherein the alignment device does not comprise contacts for electrically coupling with the semiconductor component.

24. A mechanism for loading a socket with a semiconductor component, the mechanism comprising:
a device for opening the socket; and
a centering device that aligns the mechanism in relation to the socket, wherein the centering device is used for aligning the mechanism in relation to a precision alignment device, the precision alignment device comprising a device for aligning the semiconductor component in relation to an aligned position for placement on the socket, wherein the precision alignment device and the socket are physically separate units.

25. A system for testing a packaged component, the system comprising:
a loading machine, the loading machine comprising,
a loader head disposed on the loading machine, the loader head being capable of picking up the packaged component, and
a projection disposed on the loader head;
a socket comprising,
a plurality of contacts that correspond to a plurality of pins on the packaged component,
an opening mechanism wherein,
the socket is pushed into an open position while the projection is placed within a receptacle,
the socket can accept the packaged component while the socket is in the open position,
the socket is in a closed position when the projection is absent from the receptacle, and
the socket mechanically prevents release of the packaged component while the socket is in the closed position;
a precision aligning device comprising a centering recess disposed on a planar surface, the centering recess dimensioned to push the packaged component into an aligned position when the loader head is in contact with the precision aligning device, wherein the precision aligning device and the socket are physically separate units; and
a packaged device tester attached to the socket.

26. The system of claim 25, wherein the loader head comprises a vacuum system that picks up the packaged component.

27. The system of claim 25, wherein:
the loader head further comprises centering pins, wherein the centering pins correspond to and are keyed to fit into centering holes in the precision aligning device, and wherein the centering pins correspond to and are keyed to fit into centering holes in the socket;
the centering pins on the loader head and the centering holes in the precision aligning device mechanically align the loader head with the precision aligning device; and
the centering pins on the loader head and the centering holes in the socket mechanically align the loader head with the socket.

28. The system of claim 27, wherein the centering pins comprise a conical section.

29. The system of claim 25, wherein the centering recess comprises guiding sides that move the packaged component into the aligned position, 30. The system of claim 29, wherein the guiding sides comprise tapered edges.

31. The system of claim 30, wherein the tapered edges run at an angle from inside edges of the centering recess.

32. An apparatus for loading a socket with a semiconductor component, the apparatus comprising:
a grabber device for grabbing the semiconductor component; and
an aligning device for aligning the semiconductor component with the grabber device, the aligning device comprising a centering recess, the centering recess having an outer dimension substantially similar to an outer dimension of the semiconductor component, where the centering recess is positioned so that the semiconductor component becomes positioned on the grabber device to a correct position with respect to a socket when the grabber device is coupled with the aligning device, and wherein the alignment device and the socket are physically separate units.

33. The apparatus according to claim 32, wherein the grabber device comprises an attachment which causes the socket to open when the grabber device is coupled with the socket.

34. The apparatus according to claim 33, wherein the attachment comprises a tapered plane wherein:
the tapered plane pushes a mechanical device within the socket as the grabber device is moved toward the socket; and
the mechanical device opens the socket as the tapered plane pushes the mechanical device.

35. The apparatus according to claim 34, wherein the mechanical device is coupled to spring loaded contacts, the spring loaded contacts being held in an open position when the grabber device is coupled to the socket, and the spring loaded contacts being in a closed position when the grabber device is not coupled to the socket.

36. The apparatus according to claim 35, wherein the spring loaded contacts hold the semiconductor component in the socket, and wherein the spring loaded contacts are electrically coupled to pins on the semiconductor component.

37. The apparatus according to claim 36, wherein the spring loaded contacts comprise v-shaped contacts.

38. The apparatus according to claim 36, wherein the semiconductor component is in a TSOP package.

39. The apparatus according to claim 32, wherein the grabber device comprises a vacuum device, wherein the vacuum device is used to lift the semiconductor component.

40. The apparatus according to claim 32, wherein the centering recess comprises tapered sides, wherein the tapered sides guide the semiconductor component into the centering recess when the grabber device is coupled with the aligning device.

41. An apparatus for loading a socket with a semiconductor component, the apparatus comprising:
a grabber device for grabbing the semiconductor component, the grabber device comprising a device for opening the socket when the grabber device with the semiconductor component is moved toward the socket; and
a centering device that aligns the grabber device in relation to the socket and in relation to an alignment device that aligns the semiconductor component to a correct position with respect to the grabber device when the grabber device is coupled with the alignment device, wherein the centering device comprises pins that align with corresponding centering openings disposed on the socket and/or with corresponding centering openings disposed on the alignment device, and wherein at any particular instance the centering device cannot align with both the alignment device and the socket.

42. The apparatus of claim 41, wherein the socket comprises:
a base element and contacts to be opened by the grabber device, wherein the centering device comprises a first shape which fits into a corresponding second shape in the alignment device and into a corresponding third shape in the socket, wherein the alignment device comprises a recess for centering the semiconductor component in a correct position for placement in the socket, and wherein the centering device comprises pins that align with corresponding centering openings disposed on the socket and/or with corresponding centering openings disposed on the alignment device, wherein the alignment device, the grabber device, and the socket are all physically separate units.

43. A system for testing a packaged component, the system comprising:
- a loading machine, the loading machine comprising,
  - a loader head disposed on the loading machine, the loader head being capable of picking up the packaged component, and
  - a projection disposed on the loader head;
- a socket comprising,
  - a plurality of contacts that correspond to a plurality of pins on the packaged component,
  - an opening mechanism wherein,
    - the socket is pushed into an open position while the projection is placed within a receptacle,
    - the socket can accept the packaged component while the socket is in the open position,
    - the socket is in a closed position when the projection is absent from the receptacle, and
    - the socket mechanically prevents release of the packaged component while the socket is in the closed position;
- a precision aligning device comprising a centering recess disposed on a planar surface, the centering recess dimensioned to push the packaged component into an aligned position when the loader head is in contact with the precision aligning device;
- a centering device comprising pins, wherein the pins align with corresponding centering openings disposed on the socket and/or with corresponding centering openings disposed on the precision aligning device, and wherein at any particular instance the centering device can not align with both the precision aligning device and the socket; and
- a packaged device tester attached to the socket.

44. An apparatus for loading a socket with a semiconductor component, the apparatus comprising:
- a grabber device for grabbing the semiconductor component;
- an aligning device for aligning the semiconductor component with the grabber device, the aligning device comprising a centering recess, the centering recess having an outer dimension substantially similar to an outer dimension of the semiconductor component, where the centering recess is positioned so that the semiconductor component becomes positioned on the grabber device to a correct position with respect to a socket when the grabber device is coupled with the aligning device; and
- a centering device comprising pins, wherein the pins align with corresponding centering openings disposed on the socket and/or with corresponding centering openings disposed on the aligning device, and wherein at any particular instance the centering device can not align with both the aligning device and the socket.

45. An apparatus for loading a socket with a semiconductor component, the apparatus comprising:
- a grabber device for grabbing the semiconductor component, the grabber device comprising a device for opening the socket; and
- a centering device that aligns the grabber device in relation to the socket, and in relation to an alignment device that aligns the semiconductor component to a correct position with respect to the grabber device, wherein the alignment device and the socket are physically separate units, and wherein the alignment device does not comprise contacts for electrically coupling with the semiconductor component.

* * * * *